US012614767B2

(12) United States Patent
Sulzbacher

(10) Patent No.: US 12,614,767 B2
(45) Date of Patent: *Apr. 28, 2026

(54) DEVICE AND METHOD FOR TESTING A BATTERY

(71) Applicant: HAHN Automation GmbH, Rheinböllen (DE)

(72) Inventor: Martin Sulzbacher, Dörrebach (DE)

(73) Assignee: HAHN AUTOMATION GMBH, Rheinböllen (DE)

( * ) Notice: Subject to any disclaimer, the term of this patent is extended or adjusted under 35 U.S.C. 154(b) by 144 days.

This patent is subject to a terminal disclaimer.

(21) Appl. No.: 18/322,139

(22) Filed: May 23, 2023

(65) Prior Publication Data

US 2023/0378553 A1     Nov. 23, 2023

(30) Foreign Application Priority Data

May 23, 2022    (DE) ..................... 10 2022 112 996.9

(51) Int. Cl.
| | |
|---|---|
| *H01M 10/42* | (2006.01) |
| *G01R 1/04* | (2006.01) |
| *G01R 31/00* | (2006.01) |
| *G01R 31/385* | (2019.01) |

(52) U.S. Cl.
CPC ...... *H01M 10/4285* (2013.01); *G01R 1/0416* (2013.01); *G01R 31/3865* (2019.01); *H01M 10/4228* (2013.01); *G01R 31/005* (2013.01)

(58) Field of Classification Search
CPC ......... H01M 10/4285; H01M 10/4228; H01M 10/48; G01R 1/0416; G01R 31/3865; G01R 31/005; G01R 31/36; Y02E 60/10
See application file for complete search history.

(56) References Cited

U.S. PATENT DOCUMENTS

| | | | |
|---|---|---|---|
| 2003/0078743 A1* | 4/2003 | Bertness | .............. G01R 31/385 |
| | | | 702/63 |
| 2005/0218902 A1* | 10/2005 | Restaino | ............ G01R 31/3648 |
| | | | 324/433 |
| 2009/0025995 A1* | 1/2009 | Wang | ................... B62D 25/105 |
| | | | 180/69.2 |

(Continued)

FOREIGN PATENT DOCUMENTS

| | | |
|---|---|---|
| CA | 2324196 A1 | 4/2002 |
| CN | 206781805 U | 12/2017 |
| CN | 211536277 U | 9/2020 |

(Continued)

OTHER PUBLICATIONS

U.S. Non-Final Office Action for U.S. Appl. No. 18/322,064, dated Mar. 28, 2025, 27 pages.

*Primary Examiner* — Lee E Rodak
*Assistant Examiner* — Zannatul Ferdous
(74) *Attorney, Agent, or Firm* — CANTOR COLBURN LLP

(57) ABSTRACT

A device for testing a battery, having a transport system, wherein the transport system is configured for receiving the battery, for transporting the battery to a test position, and for transporting the battery out of the test position. The device also includes an interface configured to supply the battery arranged in the test position with electric power and configured to supply the battery arranged in the test position with gas.

17 Claims, 8 Drawing Sheets

(56)                References Cited

U.S. PATENT DOCUMENTS

2017/0312561 A1 *  11/2017  Polan ..................... A62C 37/11
2022/0285803 A1 *   9/2022  Hsiao ................. H01M 10/425

FOREIGN PATENT DOCUMENTS

CN        216539668  U       5/2022
CN        115706277  A   *   2/2023
DE     102011112532  A1      3/2013
DE     102012106147  B4      7/2015
DE     102016112151  A1      1/2018
DE     102019101306  A1  *   5/2019    ......... G01R 31/3865
DE     102019115901  A1     12/2020
DE     102020111464  A1     10/2021
DE     102020128794  A1      5/2022

* cited by examiner

16

4

54

37  41  36  43       42  39

DEVICE AND METHOD FOR TESTING A BATTERY

CROSS-REFERENCE TO RELATED APPLICATIONS

This application claims the benefit of German patent application no. 10 2022 112 996.9, filed on May 23, 2022, the disclosure of which is incorporated herein by reference in its entirety.

TECHNICAL FIELD

The present disclosure relates to a device and a method for testing a battery.

BACKGROUND

Modern motor vehicles are increasingly equipped with completely electric motor drive or hybrid drive. A battery, which is also designated as a traction battery, is used here to supply one electric motor or multiple electric motors with electric power in order to drive the relevant vehicle by means of the electric motor or by means of multiple electric motors.

During the production of such batteries, they are subjected to a variety of tests. Among other things, a power test of the battery takes place, which ensures the functionality and functional reliability in the context of an end-of-line test. A relevant battery to be tested is charged and discharged again multiple times in a short time here. Furthermore, the battery can be subjected to a high voltage for insulation testing.

If there is a defect of the battery, the battery can catch on fire. Such a fire and the accompanying smoke development represent a significant hazard to the persons located in the manufacturing environment and the manufacturing devices and buildings used to produce and test the battery.

SUMMARY

Against this background, the present disclosure is based on the technical problem of specifying a device and a method for testing a battery which improve the safety in the context of testing a battery. The above-described technical problem is solved by each of the independent claims. Further embodiments of the disclosure result from the dependent claims and the following description.

According to a first aspect, the disclosure relates to a device for testing a battery, having a transport system, wherein the transport system is configured to receive the battery, to transport the battery toward a test position, and to transport the battery out of the test position, having an interface, wherein the interface is configured to supply the battery arranged in the test position with electric power, wherein the interface is configured to supply the battery arranged in the test position with electric power and wherein the interface is configured to supply the battery arranged in the test position with gas.

In particular, it can be provided that the device is configured for the simultaneous leak-tightness test and power test of a battery arranged in the test position, wherein the interface is configured both to supply the battery arranged in the test position with electric power and to introduce gas into the battery arranged in the test position.

The simultaneous testing of the leak-tightness and the power has the advantage that an atmosphere which is only combustible with difficulty or is fire-retardant is created by the gas within the battery, so that the fire development and smoke development in case of a defect can be inhibited.

According to one embodiment of the device, it can be provided that the device includes a fire protection hood, which can be lowered onto the transport system, to shield the battery in relation to the surroundings.

The fire protection hood enables fire and smoke development to be contained and limited if a battery to be tested catches on fire during a power test.

Such a battery, which has caught on fire, having fire protection hood lowered thereon or having fire protection hood lowered onto the transport system can be transported out of the test position by means of the transport system. For example, it can be provided that the battery which has caught on fire is transported into a protective chamber, which can be evacuated and has smoke gas extraction, or a protective cell, which can be evacuated and has smoke gas extraction, or into an outside area, to enable extinguishing and/or controlled burning out of the battery.

The device according to the disclosure is in particular a test stand for power testing or end-of-line testing of a battery.

When reference is made in the present case to a battery, it is in particular a traction battery for a motor vehicle, which is provided to supply one or more electric motors of the motor vehicle with electric power. The motor vehicle is in particular a motor vehicle driven solely by electric motor or a hybrid vehicle here.

The battery can include one module or multiple modules. A module can include multiple cells or battery cells. The method according to the disclosure and the device according to the disclosure can be used for testing modules or cells, in particular can be used for testing individual modules or cells.

A battery to be tested is not itself part of the device according to the disclosure, rather is solely tested by means of the device according to the disclosure.

The interface for supplying the battery arranged in the test position with electric power can be provided both for charging and for discharging the battery.

The interface can be provided in particular to supply the battery arranged in the test position, for example, with an electric power from 1 kW to 500 kW (kilowatts), in particular to supply it with a charging power from 1 kW to 500 kW (kilowatts).

In the scope of a high-voltage test, the battery can be subjected, for example, to up to 7000 V.

The fire protection hood can be designed so it can be automatically lowered.

For example, it can be provided that lowering of the fire protection hood is triggered if a controller of the device detects a hazardous situation, such as fire development and/or smoke development, by means of one or more sensors. The device can therefore include a controller which is configured to automatically lower the fire protection hood.

Alternatively or additionally, it can be provided that the lowering of the fire protection hood can be able to be triggered by a machine operator. For example, a switching element, such as a pushbutton, a switch, a lever, or the like can be provided to manually trigger the lowering of the fire protection hood. If a machine operator recognizes a hazardous situation, such as fire development and/or smoke development, and automatic lowering of the fire protection hood fails or does not take place, the machine operator can trigger the lowering of the fire protection hood by actuating the switching element.

It can be provided that the fire protection hood is positionable in a waiting position above the test position viewed in the vertical direction and can be lowered from the waiting position onto the battery to be tested, which is arranged in the test position, or can be lowered onto the transport system.

It can be provided that the fire protection hood is positionable in a waiting position with a lateral offset to the test position viewed in the vertical direction and can be lowered from the waiting position onto the battery to be tested, which is arranged in the test position, or can be lowered onto the transport system.

If a test of the battery runs without errors, the fire protection hood remains in the waiting position. It can therefore be provided that a plurality of batteries is removed by means of the transport system in succession into the test position, subjected to a power test, and transported away again by means of the transport system, without lowering of the fire protection hood occurring. The fire protection hood is therefore only lowered if needed, i.e., upon the presence of a hazardous situation, onto the transport system in order to shield the relevant battery, which has caught on fire and is located in the test position, from the surroundings.

According to a further embodiment of the device, it can be provided that the fire protection hood can be lowered in a solely linear movement onto the battery to be tested, which is arranged in the test position, or can be lowered onto the transport system. A cost-effective and efficient constructive solution can thus be specified, which enables rapid shielding or encapsulation of the battery from the surroundings.

The device can include a handling unit, wherein the handling unit is configured for automatically lowering and raising the fire protection hood.

Such a handling unit can include, for example, one or more numerically controlled axes or a robot to hold and move the fire protection hood.

The handling unit can include a coupling for coupling the fire protection hood to the handling unit and for decoupling the fire protection hood from the handling unit. The coupling can be a mechanical clutch, for example.

In particular, it can be provided that an actuatable coupling element, such as a detent element, a hook, a pin, or the like is provided on the handling unit, which engages in a formfitting manner in a shaped element or an undercut, which is formed on the fire protection hood, in order to couple the fire protection hood in a formfitting manner to the handling unit. It can therefore be provided in particular that the actuatable coupling element is movable from a release position, in which the fire protection hood is not coupled to the handling unit, into a coupling position, in which the fire protection hood is coupled in a formfitting manner to the handling unit, in order to fix the fire protection hood on the handling unit or to couple the fire protection hood to the handling unit.

According to alternative embodiments, it can be provided that such a handling unit alternatively or additionally includes a magnetic coupling in order to couple the fire protection hood to the handling unit or to decouple the fire protection hood from the handling unit.

Alternatively or additionally, it can be provided that the handling unit includes a gripping unit in order to grip the fire protection hood and in order to raise or lower it. In particular, such a gripping unit can be configured to grip around the fire protection hood on two sides or multiple sides or to grip around one or more shaped elements of the fire protection hood on two sides or multiple sides, in order to raise or lower the fire protection hood.

For the case that the testing of one battery or multiple batteries takes place without errors, i.e., in the present meaning without fire and/or smoke development, the handling unit is configured to keep the fire protection hood continuously in the waiting position or waiting setting for the period of time of this error-free operation.

It can be provided that the handling unit includes a carrier arranged above the test position, viewed in the vertical direction, such as a gantry or a cantilever arm, on which an axis of the handling unit for lowering and raising the fire protection hood is arranged, wherein the axis is in particular a linear axis. The above-mentioned constructive embodiment enables reliable and cost-effective positioning of the fire protection hood above the test position. In particular in combination with a linear axis, which can be a numerically controlled axes, efficient automation for raising and lowering and for holding the fire protection hood in the waiting position can be implemented.

The linear axis can be a pneumatic cylinder. The linear axis can be a hydraulic cylinder. The linear axis can be a servoelectric spindle drive.

The fire protection hood can include a fireproof material, can be coated using a fireproof material, or can consist of a fireproof material.

The fire protection hood can be embodied in skeleton construction and can include a framework skeleton having planar filler elements. The planar filler elements can also be designated as fire protection plates or fire protection mats.

The framework skeleton can be at least partially formed from a metallic material, such as aluminum, aluminum alloys, or the like. The fire protection plates or fire protection mats can consist of a noncombustible filler material, in particular mineral fire protection material, or of a noncombustible material or can include a noncombustible filler material or a noncombustible material.

The fire protection plates or fire protection mats can be held detachably and exchangeably on the framework skeleton, in particular can be screwed to the framework skeleton.

The fire protection hood can be essentially cuboid and can include an opening facing toward the test position.

The fire protection hood can have, for example, a length of approximately 20 cm to approximately 350 cm, in particular can have a length of 100 cm-250 cm.

The fire protection hood can have, for example, a height of approximately 5 cm to approximately 100 cm, in particular a height of approximately 20 cm to approximately 60 cm.

The fire protection hood can have, for example, a width of approximately 10 cm to approximately 250 cm, in particular can have a width of approximately 30 cm to approximately 150 cm.

The fire protection hood can have a weight of approximately 10 kg to approximately 250 kg.

The fire protection hood can be configured for shielding a volume of 0.001 $m^3$-8.75 $m^3$ from the surroundings, in particular can be configured for shielding a volume of 0.5 $m^3$-2.25 $m^3$ from the surroundings.

It can be provided that one overpressure opening with filter is integrated or multiple overpressure openings with filter are integrated in the fire protection hood, which protect from an overpressure in the interior of the fire protection hood in the case of significant gas development.

The overpressure opening can include an overpressure valve.

The overpressure openings can be formed by a porosity of a material of the fire protection hood, which permits a gas throughput from a certain internal pressure, in order to reduce the overpressure. The fire protection hood therefore essentially encapsulates the battery from the surroundings but permits an overpressure equalization.

The interface can include a first connection arrangement, which is fastened on the transport system, and the interface can include a second connection arrangement, which is connectable to the first connection arrangement, wherein the first connection arrangement is movable by means of the transport system relative to the second connection arrangement.

The first connection arrangement and the second connection arrangement therefore in particular form the interface, wherein the first connection arrangement and the second connection arrangement in particular include an arrangement of contact elements matching with one another, such as sockets or pins, in order to establish one or more detachable plug connections. For example, the first connection arrangement can include two or more sockets, while the second connection arrangement includes two or more pins matching in these sockets, or vice versa, wherein the connection arrangements each include a plug face matching with one another.

In particular, it can be provided that a battery to be tested is connected via cables or lines to the first connection arrangement before the battery is moved into the test position by means of the transport system. It can be provided that the first connection arrangement is connectable to the battery in the area of a side facing away from the second connection arrangement or, if the battery is in the test position, is connected to the battery to be tested. A connection of the battery to be tested to the first connection arrangement can take place automatically.

It can be provided that the fire protection hood covers the first connection arrangement in a state lowered onto the transport system and shields it from the surroundings and the fire protection hood in particular does not cover the second connection arrangement in the state lowered onto the transport system.

If the fire protection hood is in its state lowered onto the transport system, the fire protection hood therefore covers both the first connection arrangement and the battery to be tested in this case. This has the advantage that the battery to be tested can remain connected to the first connection arrangement in case of hazard and the battery, in the state connected to the first connection arrangement, can be shielded or encapsulated together with the first connection arrangement from the surroundings and can be transported away by means of the transport system out of the test position.

It can be provided that the test position is specified by a support structure. Such a support structure can specify, for example, a parking position for a transport carriage or a holding position for a workpiece carrier, which is conveyed via a belt and carries the battery.

For example, it can be provided that the second connection arrangement of the interface is fastened to the support structure. The second connection arrangement of the interface is therefore in particular arranged in a stationary manner on the support structure, while the first connection arrangement is movable by means of the transport system together with the battery. When it is stated in the present case that the second connection arrangement is positioned in a stationary manner, this does not exclude the second connection arrangement including actuatable or movable components, which include, for example, a lifting movement or positioning movement for automatically coupling or decoupling the interface.

Therefore, in this case stationary means that the second connection arrangement remains with its possibly actuatable components in the area of the test position or is fastened to the support structure in the area of the test position.

The interface can be able to be automatically coupled and decoupled, wherein the interface in particular includes a mechanical actuator for automatically coupling and decoupling the interface. Such a mechanical actuator can be, for example, an electrically, pneumatically, or hydraulically actuated lifting cylinder, in order to move the first connection arrangement or the second connection arrangement from a disconnected position, in which the first connection arrangement and the second connection arrangement are decoupled from one another, into a connected position, in which the first connection arrangement and the second connection arrangement are coupled to one another.

The possibility of automatically coupling or decoupling the interface has the advantage that in case of hazard, a supply of the battery with electric power can be automatically disconnected immediately, in that the first connection arrangement and the second connection arrangement are physically moved apart from one another. If the fire protection hood is configured to shield both the battery and the first connection arrangement in the state lowered onto the transport system, the automated decoupling moreover enables rapid lowering of the fire protection hood if the interface is formed in the lowering path of the fire protection hood.

It can be provided that the mechanical actuator for automatically coupling and decoupling the interface is held on the support structure.

According to a further embodiment of the device, at least one mechanical lock can be provided to lock and/or align the battery to be tested and/or the transport system in the test position. The mechanical lock can in particular be able to be automatically coupled and decoupled.

The mechanical lock can be configured, for example, for formfitting locking of the battery and/or the transport system and/or for formfitting positioning of the battery and/or the transport system in the test position.

It can be provided that at least a part of the mechanical lock is fastened on the support structure. For example, a positioning element which is configured to engage in a formfitting manner in an undercut or in an opening of the transport system, can be fastened on the support structure. Such a positioning element can be movable, for example, by means of an electrically, pneumatically, or hydraulically actuated lifting cylinder from a release position into a blocking or centering position.

It can be provided that the mechanical lock includes two or more positioning elements.

It can be provided that the mechanical lock includes first positioning elements for fixing the battery and/or the transport system in the test position and that the mechanical lock includes second positioning elements for positioning or centering the battery and/or the transport system in the test position.

The transport system can include a transport carriage.

The transport carriage can include rollers.

The transport carriage can include a drive for automatically or semi-automatically moving the transport carriage. For example, it can be provided that the transport carriage is movable completely automatically toward the test position and out of the test position.

It can be provided that the transport carriage is movable by an employee by means of a wired or a wireless remote control.

It can be provided that the transport carriage is manually movable.

The transport carriage can include the first connection arrangement. The first connection arrangement can be received in particular on a mount of the transport carriage, such as a support plate, a support frame, a support profile, or the like.

The transport carriage can be alignable and lockable by means of the mechanical lock.

Alternatively or additionally, it can be provided that the transport system includes a transport belt. In particular, it can be provided that the transport system includes workpiece carriers, which are configured to receive a respective battery to be tested, wherein the battery is movable by means of an assigned workpiece carrier on the transport belt.

As already described above, the interface can include contact elements for establishing an electrically conductive connection, such as a plug connection having pin and socket or the like.

It can be provided that the interface includes contact elements for establishing a fluid connection, such as a fluid coupling or the like, for introducing gas for the leak-tightness test into a battery arranged in the test position, wherein in particular an inert gas, such as helium or the like, can be provided for the leak-tightness test via the interface.

The interface can be configured for the power supply of the battery for a power test and for the gas supply of the battery for a leak-tightness test.

In particular, it can be provided that the device is configured for the simultaneous leak-tightness test and power test of a battery arranged in the test position, wherein the interface is configured both to supply the battery arranged in the test position with electric power and also to introduce gas into the battery arranged in the test position.

The simultaneous testing of the leak-tightness and the power has the advantage that an atmosphere which is only combustible with difficulty or is fire-retardant is created by the gas within the battery, so that the fire development and smoke development in case of a defect can be inhibited.

A temperature sensor can be provided for monitoring a temperature of the battery to be tested, wherein the temperature sensor is provided in particular for monitoring a temperature in the interior of the battery to be tested.

Alternatively or additionally, a smoke gas sensor can be provided for monitoring smoke development of a battery to be tested.

The above-mentioned sensors are used for monitoring the battery during the power test, i.e., during the charging and/or discharging of the battery, and/or during a high-voltage test.

It can be provided that the fire protection hood can be automatically lowered in dependence on a signal of the temperature sensor and/or the smoke gas sensor.

For example, it can be provided that a drive and a coupling element, which are provided as part of a handling device for holding and moving the fire protection hood, are controllable by means of a controller on the basis of the signals of the above-mentioned sensors. If, for example, a threshold value for a temperature of the battery, in particular in the interior of the battery, is exceeded, the lowering of the fire protection hood by means of the handling device can be initiated. This applies similarly insofar as alternatively or additionally, for example, exceeding a threshold value for a smoke gas concentration is detected by the smoke gas sensor.

After the lowering of the fire protection hood on the transport system, the fire protection hood is decoupled and a transport of the battery out of the test position can also be triggered automatically by means of the controller.

Furthermore, alternatively or additionally, before the lowering of the fire protection hood the interface and/or a lock can be automatically releasable by means of the controller, in order, for example, to completely mechanically decouple a transport carriage of the transport system, for example, from a support structure.

It can be provided that the interface includes contact elements for establishing a fluid connection, such as a fluid coupling or the like, for introducing coolant medium into a cooling circuit of the battery arranged in the test position. The battery can therefore be temperature controlled during a testing procedure. In particular, the interface can include a first fluid coupling for introducing a gas and a second fluid coupling for introducing a coolant medium, so that the battery can simultaneously be filled with gas and supplied with a coolant medium during a power test.

According to a second aspect, the disclosure relates to a method for testing a battery, having the following method steps: providing the battery to be tested on a transport system; transporting the battery into a test position by means of the transport system; supplying the battery to be tested with electric power and with gas via an interface.

According to one embodiment of the method, it is provided that the battery to be tested is supplied with electric power and filled with a gas via the interface, wherein both a power test and a leak-tightness test of the battery are carried out simultaneously.

As already discussed, the simultaneous leak-tightness test together with the power test has the advantage that an atmosphere which is difficult to combust or is fire retardant can be created within the battery by the supplied gas, in particular inert gas, in order to increase the safety of the test method and the test environment as a whole.

During the leak-tightness test, a probe is guided along the battery in order to detect gas escaping from the battery. The leak-tightness test is therefore carried out in particular in the present case as a so-called sniff test.

It can be provided that a fire protection hood, which can be lowered onto the transport system, is provided for shielding the battery to be tested from the surroundings.

The method has the advantage that the safety of the test of a battery can be improved by means of the fire protection hood.

All method steps mentioned above with respect to the device according to the disclosure can be subject matter of the described method according to the disclosure.

The method according to the disclosure can be carried out by means of an above-described device according to the disclosure.

According to one embodiment of the method, it can be provided that during and/or after the supply of the battery to be tested with electric power and/or during a discharge of the battery, a temperature of the battery to be tested is monitored, in particular a temperature in the interior of the battery is monitored, and/or a smoke development of the battery to be tested is monitored, and the fire protection hood for shielding the battery to be tested is lowered if a threshold value of the temperature and/or a threshold value of the smoke development is exceeded.

The terms smoke gas development and smoke development are used synonymously in the present text. When reference is made in the present case to a battery or a battery to be tested, this relates in each case to a battery which is tested by means of the device according to the disclosure and/or by means of the method according to the disclosure.

It can be provided that the fire protection hood, after the lowering onto the transport system, is automatically decoupled from a handling unit which carries the fire protection hood. Both the lowering and also the decoupling can take place completely automatically.

According to one embodiment of the method, it is provided that the battery is automatically transported out of the test position after the lowering and decoupling.

If a battery catches fire and/or smoke gas development takes place, the battery can therefore in particular be encapsulated or shielded completely automatically from the surroundings and transported out of the test position, in order to avoid injury to persons or damage to the device or surrounding manufacturing devices or the building housing the manufacturing devices.

According to one embodiment of the method, it is provided that the interface is automatically decoupled before the lowering of the fire protection hood and/or during the lowering of the fire protection hood. In particular for the case that the interface is arranged within a lowering path, which the fire protection hood passes through starting from a waiting position to a state lowered completely onto the transport system, the automated disconnection of the interface can enable rapid and in particular interruption-free lowering of the fire protection hood onto the transport system, in order to shield or encapsulate the battery as quickly as possible from the surroundings.

It can be provided that a transport carriage of the transport system is locked and/or aligned by means of a mechanical lock in order to position the battery to be tested in the test position. Furthermore, it can be provided that the mechanical lock is automatically decoupled after the lowering of the fire protection hood. In particular, it can be provided that both the decoupling of the lock and the decoupling of the interface take place completely automatically in order to rapidly ensure complete mechanical decoupling of a transport carriage from, for example, a support structure, which carries a part of the lark and a part of the interface. In this way, faster transport away of a battery which has caught fire can be enabled.

Alternatively or additionally, it can be provided that the battery to be tested is supplied with a coolant fluid for cooling the battery via the interface.

BRIEF DESCRIPTION OF THE DRAWINGS

The disclosure is described in more detail hereinafter on the basis of a drawing illustrating exemplary embodiments. In the schematic figures.

DETAILED DESCRIPTION OF THE DRAWINGS

Figure 1:
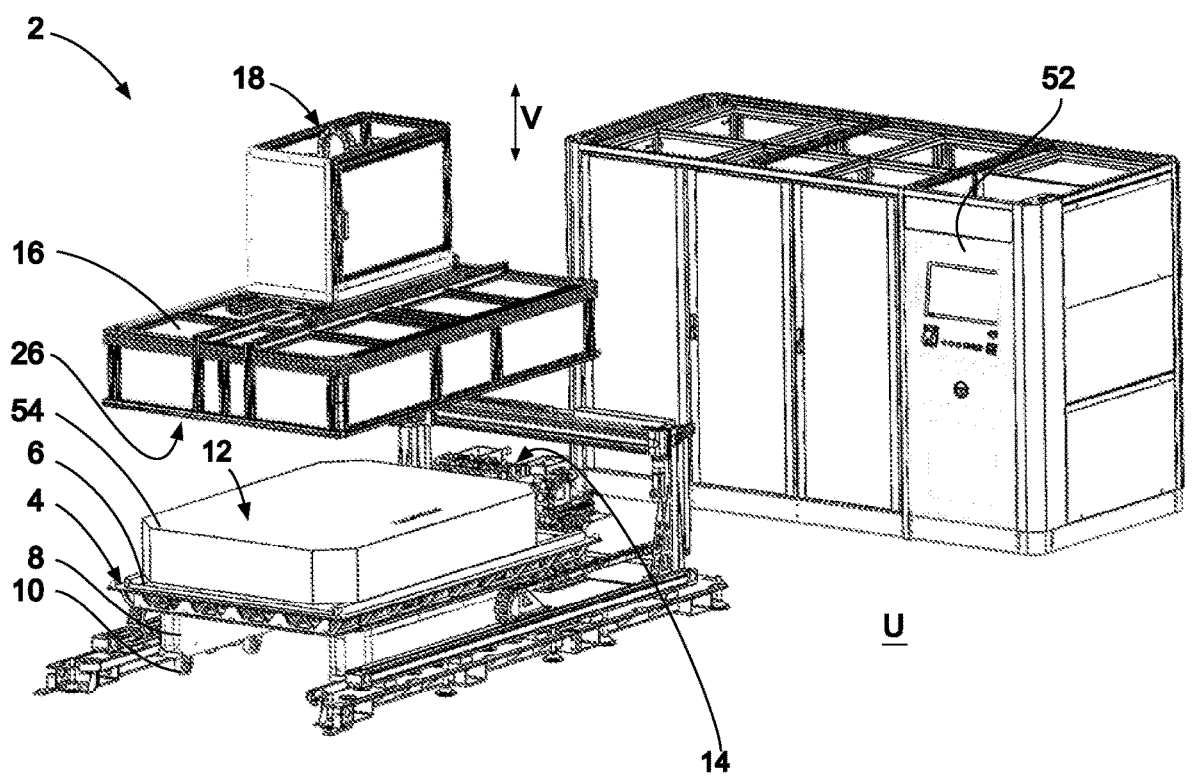
FIG. 1 shows a device according to the disclosure in a perspective view.

FIG. 1 shows a device 2 for testing a battery 54. The device 2 has a transport system 4 in the form of a transport carriage 4. The transport carriage 4 has a placement surface 6 for receiving the battery 54 to be tested. The transport carriage 4 has a drive system 8 and rollers 10 for automatic and/or manual movement of the transport carriage 4.

The transport carriage 4 is configured for the transport of the battery 54 to be tested to a test position 12 and for the transport of the relevant battery 54 to be tested out of the test position 12.

The device 2 has an interface 14, wherein the interface 14 is configured for supplying a battery 54 arranged in the test position 12 with electric power, with a gas or testing gas, and with a coolant fluid.

The device 2 has a fire protection hood 16, which can be lowered onto the transport carriage 4, for shielding the battery 54 to be tested from the surroundings U.

The fire protection hood 16 can be automatically lowered onto the transport carriage 4. For this purpose, the fire protection hood 16 is positioned above the test position 12 in a waiting position viewed in the vertical direction V.

FIG. 1 shows the fire protection hood 16 in its waiting position. The fire protection hood 16 can be lowered in the present case in a solely linear movement along the vertical direction V onto the transport carriage 4.

The fire protection hood 16 is fastened on a handling unit 18, wherein the handling unit 18 is configured for automatically lowering and raising the fire protection hood 16 and moreover is configured for holding the fire protection hood 16 in the waiting position shown in FIG. 1.

The handling unit 18 includes a coupling 20 (FIG. 6) for coupling the fire protection hood 16 to the handling unit 18 and for decoupling the fire protection hood 16 from the handling unit 18.

The handling unit 18 includes a carrier 22, arranged above the test position 12 viewed in the vertical direction V, on which an axis 24 of the handling unit 18 for lowering and raising the fire protection hood 16 is arranged. The axis 24 is in the present case a linear axis 24 in the form of a pneumatic cylinder 24, which is configured for moving the fire protection hood 16 along the vertical direction V.

The fire protection hood 16 is formed essentially cuboid. The fire protection hood 16 includes an opening 26 facing toward the test position 12.

The interface 14 has a first connection arrangement 28, which is fastened on the transport carriage 4. The interface 14 has a second connection arrangement 30, which is connectable to the first connection arrangement 28, wherein the first connection arrangement 28 is movable by means of the transport carriage 4 relative to the second connection arrangement 30.

The test position 12 is specified by a support structure 32. The second connection arrangement 30 is fastened on the support structure 32.

The test position 12 of the battery 54 corresponds to a parking position 12 of the transport carriage 4 below the fire protection hood 16, since the battery 54 is positioned by means of the transport carriage 4. The support structure 32 has side rails 34 extending in parallel to one another, which laterally delimit the parking position 12 of the transport carriage 4.

The support structure 32 has two stops 36, which represent an end-face delimitation of a movement path of the transport carriage 4 upon entering the parking position 12.

Figure 12:
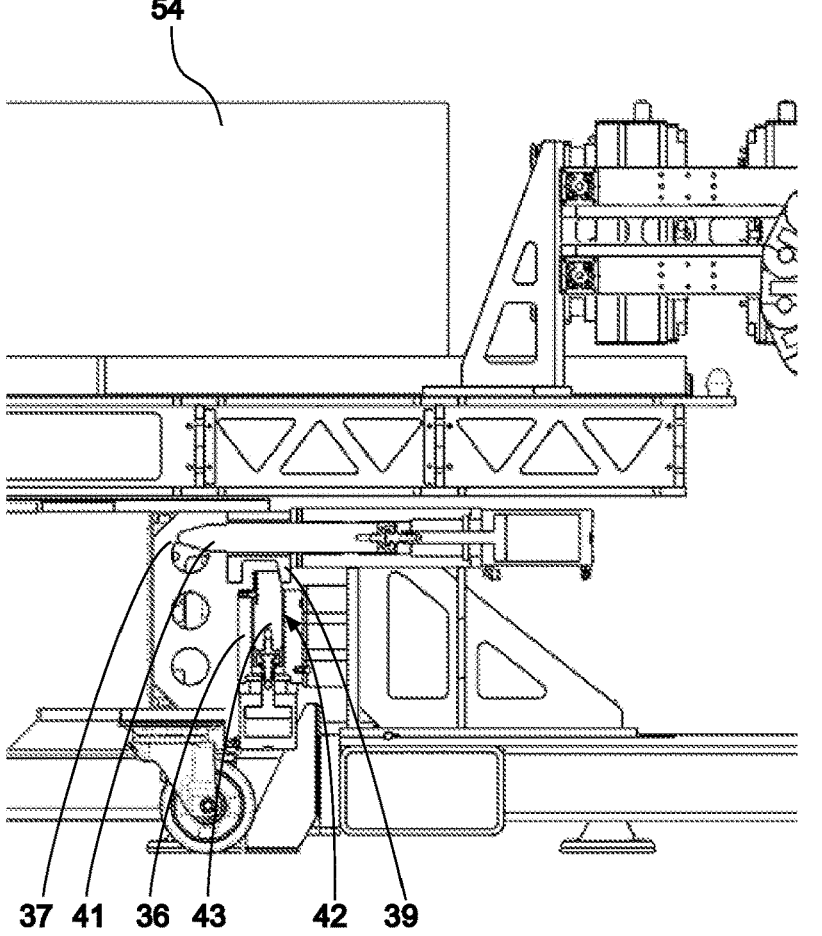
FIG. 12 shows a mechanical lock of the transport carriage in the test position.

A mechanical lock 42 is provided at the stops 36, which is configured to align and fix the transport carriage 4 on the support structure 32 (FIG. 12). The mechanical lock 42 has on each stop 26 a vertically displaceable detent element 43 in each case for the formfitting securing of the transport carriage 4 on the support structure 32 and a horizontally disposable centering element 41 in each case for the form-fitting centering of the transport carriage 4 on the support structure 32. The detent elements 43 and the centering elements 41 each engage in assigned shaped elements 37, 39 of the transport carriage 4.

The support structure 32 has a mount 38, which carries the second connection arrangement 30 of the interface 14. The second connection arrangement 30 is fastened by means of the mount 38 on the support structure 32. The first connection arrangement 28 is received on a mount 58 of the transport carriage 4.

The interface 14 can be automatically coupled and decoupled, wherein the interface 14 includes a mechanical actuator 40 for automatically coupling and decoupling the interface 14.

The mechanical actuator 40 is fastened on the mount 38 and is provided for executing a linear lifting movement in the direction of the transport carriage 4. The mechanical actuator 40 therefore carries the second connection arrangement 30 and is provided to displace the second connection arrangement 30 in the direction of the first connection arrangement 28, in order to couple them to one another, if the transport carriage 4 is in the test position 12.

The interface 14 has contact elements 44 for establishing an electrically conductive plug connection. The contact elements 44 are used to transmit an electrical charging power or discharging power in the course of a power test of the battery 54 to be tested.

The interface 14 has contact elements 46 for establishing a fluid connection for introducing testing gas for the leak-tightness test. The contact elements 46 form a fluid coupling. The contact elements 46 are used to introduce gas for the leak-tightness test into the battery 54 to be tested.

The interface 14 has contact elements 47, 49 for establishing a fluid connection for introducing coolant medium for temperature control into the battery 54 to be tested, specifically a feed line 47 and a return line 49. The contact elements 47, 49 form a fluid coupling in each case. The contact elements 47, 49 are used to introduce coolant medium into a cooling circuit of the battery 54 to be tested.

Furthermore, contact elements 51 of a measurement line, contact elements 53 of an auxiliary voltage supply, and contact elements 55 of a CAN BUS for transmitting control signals are provided at the interface 14.

The device 2 is configured for simultaneous leak-tightness testing and power testing of a battery arranged in the test position.

A temperature sensor 48 for monitoring a temperature in the interior of the battery to be tested and a smoke gas sensor 50 for monitoring a smoke development of a battery to be tested are providing for monitoring a testing procedure.

The device 2 includes a controller 52, which is configured for carrying out the power test and the leak-tightness test of the battery 54 to be tested.

The controller 52 is furthermore configured to lower the fire protection hood 16 onto the transport carriage 4 in dependence on a signal of the temperature sensor 48 and/or the smoke gas sensor 50.

The functionality of the device 2 according to the disclosure will be described hereinafter on the basis of a method according to the disclosure.

Figure 2:
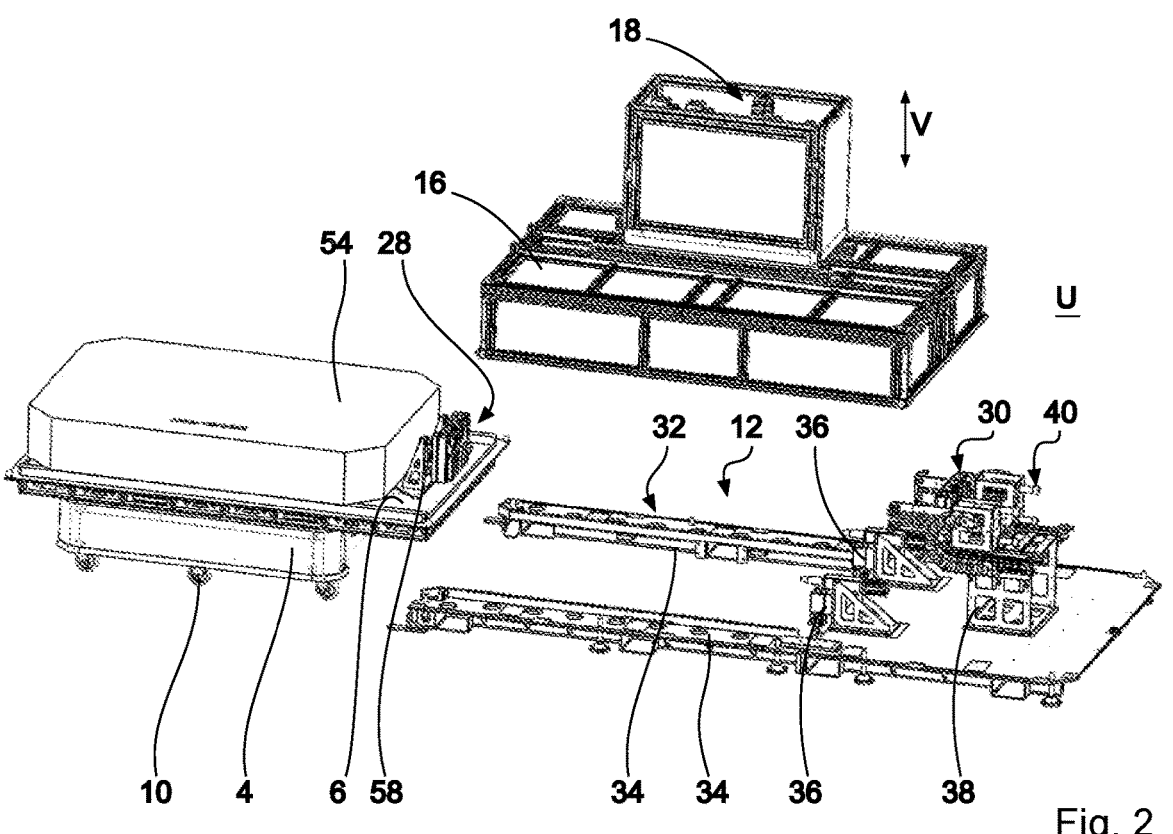
FIG. 2 shows the device from FIG. 1 in a further perspective view.
Figure 3:
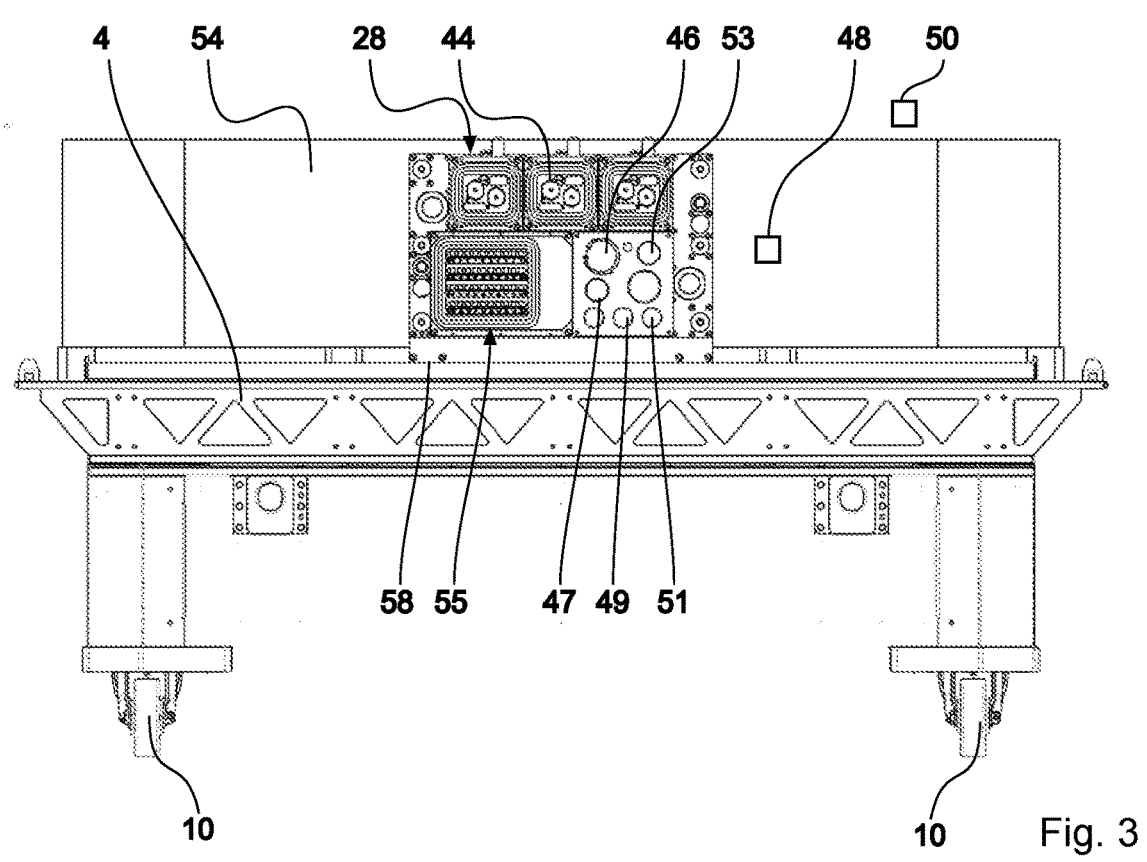
FIG. 3 shows a first connection arrangement of an interface.
Figure 4:
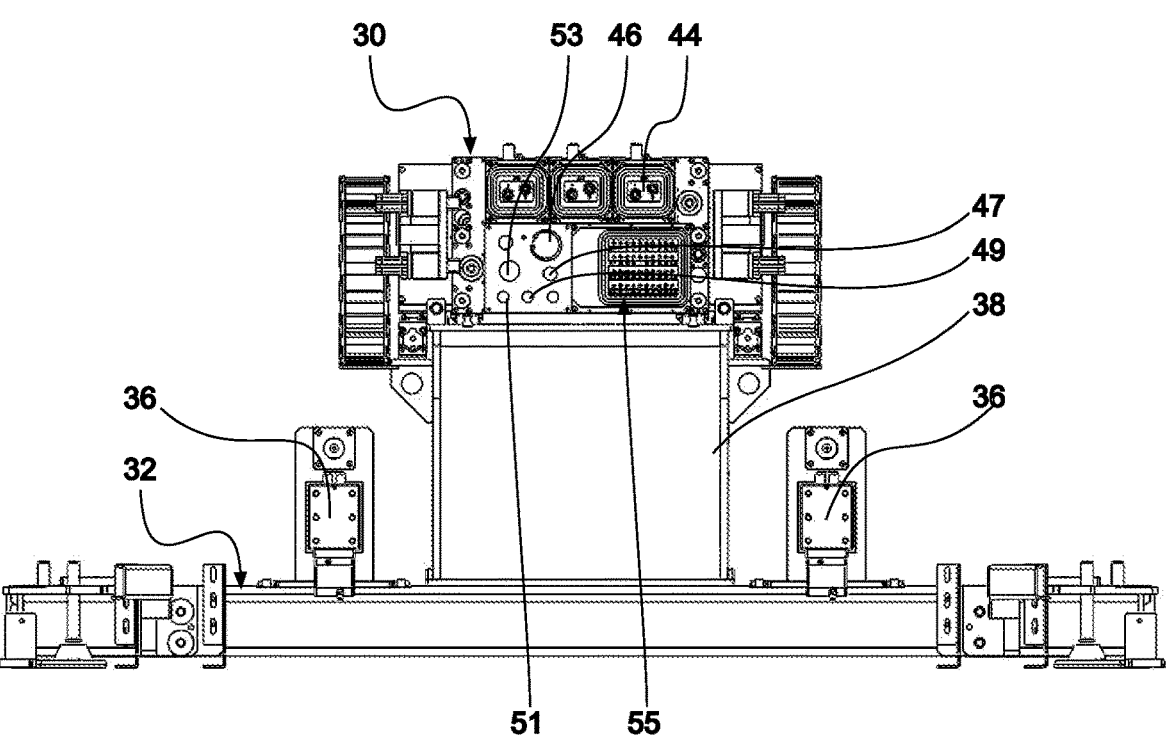
FIG. 4 shows a second connection arrangement of the interface.

In a first method step (A), the battery 54 to be tested is initially provided on the transport carriage 4 (FIG. 2) and connected to the first connection arrangement 28. Connections 57 between the first connection arrangement 28 and the battery 54 are schematically indicated in FIG. 7 and FIG. 8.

Figure 5:
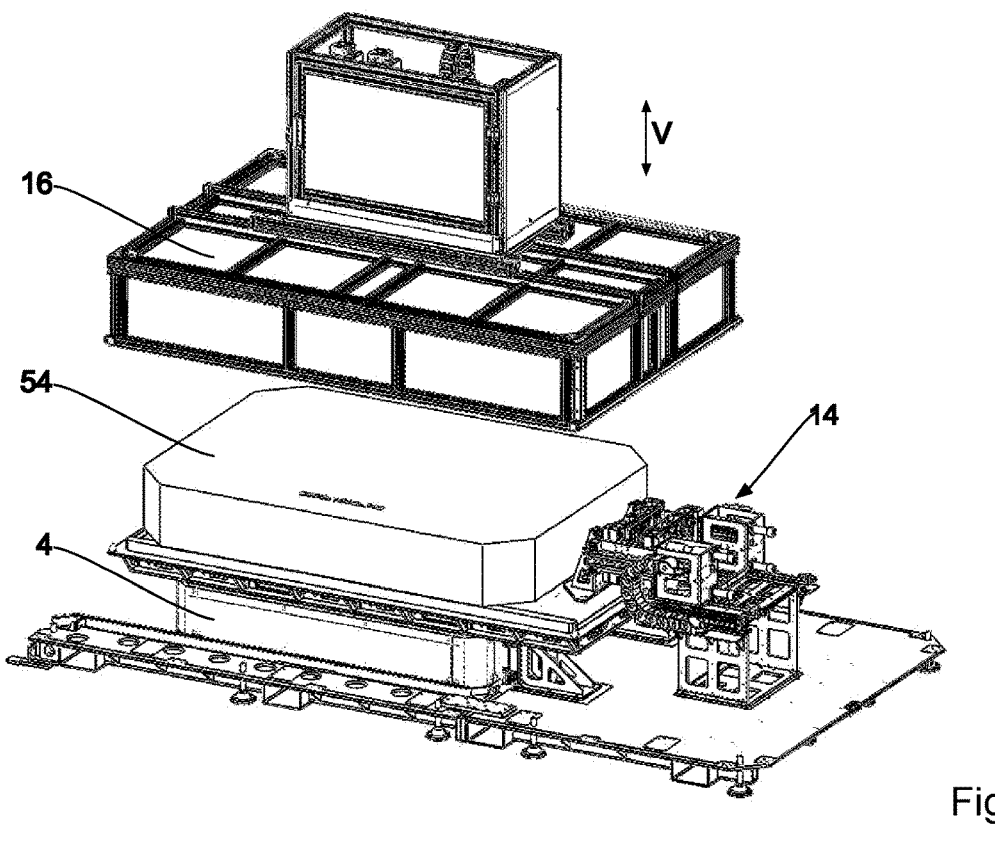
FIG. 5 shows the device from FIG. 1 with the fire protection hood in the waiting position.

The battery 54 to be tested is moved in a method step (B) on the transport carriage (4) into the test position 12 (FIG. 1, FIG. 5). The transport carriage 4 is aligned or centered and fixed on the support structure 32 by means of the mechanical lock 42.

Figure 7:
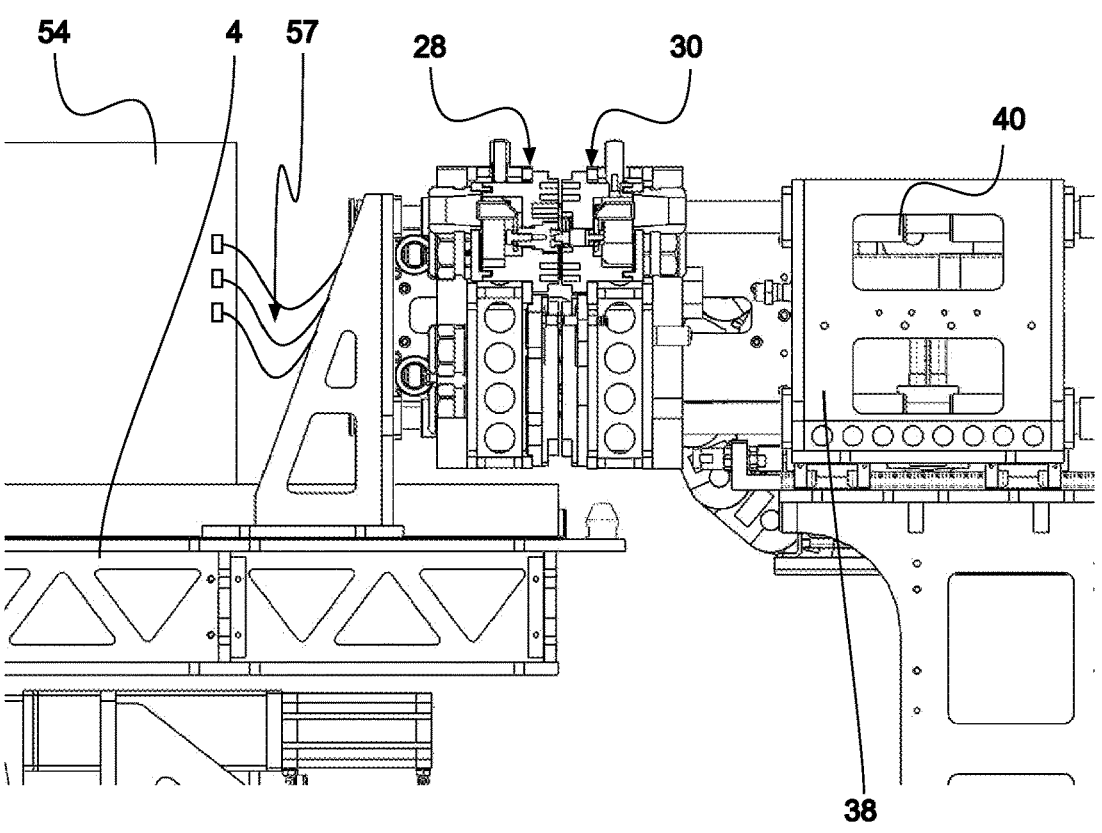
FIG. 7 shows the interface in a side view in the coupled state.
Figure 8:
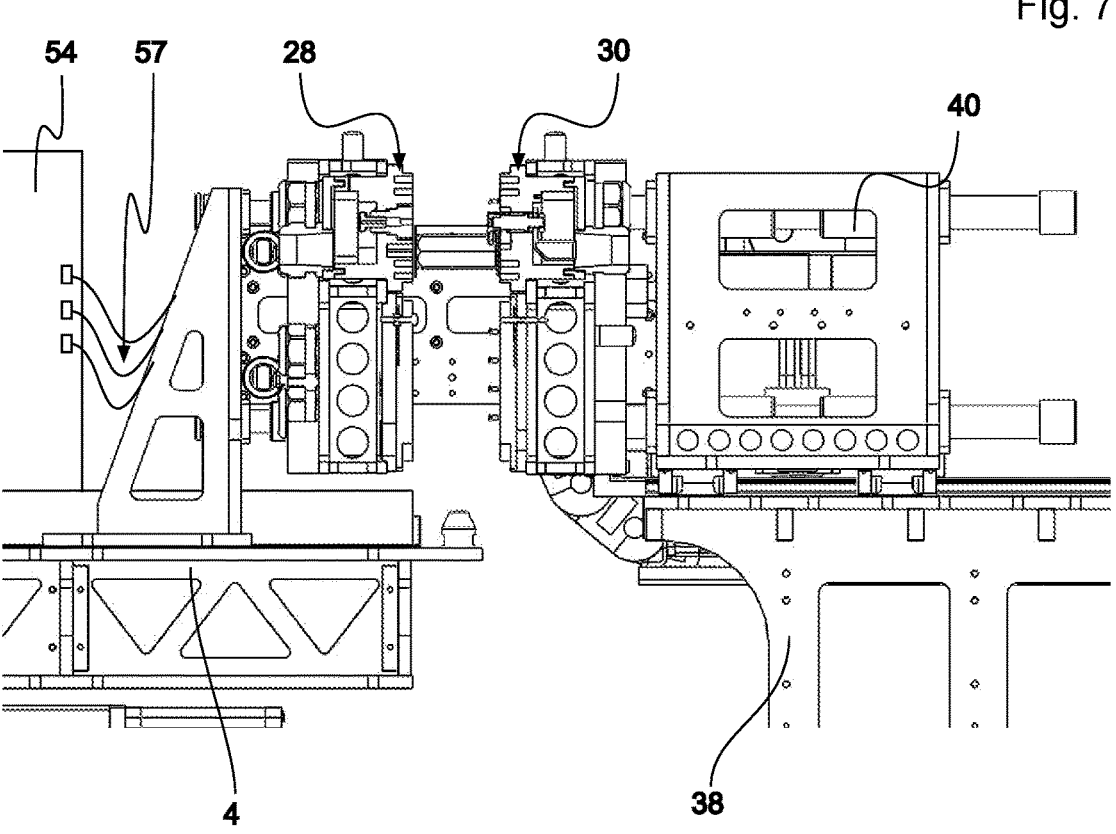
FIG. 8 shows the interface in a side view in the decoupled state.

The interface 14 is then coupled, in that the second connection arrangement 30 is moved by means of the mechanical actuator 40 out of the position according to FIG. 8 in the direction of the first connection arrangement 28, so that a plug connection is formed between the first connection arrangement 28 and the second connection arrangement 30, as shown in FIG. 7.

In a third method step (C), a power test and a leak-tightness test of the battery 54 take place simultaneously, wherein the battery 54 is both supplied with electric power and simultaneously filled with gas via the interface 14. An introduction of coolant medium via the interface 14 also takes place during this period.

If the test runs without problems, the battery 54 is automatically transported back out of the test position 12 (cf. FIG. 2), wherein before the transport away, the interface 12 and the mechanical lock 42 are decoupled (method step 21). For the case of a problem-free test, the fire protection hood 16 remains permanently in its waiting position shown in FIGS. 1, 2, and 5.

Figure 6:
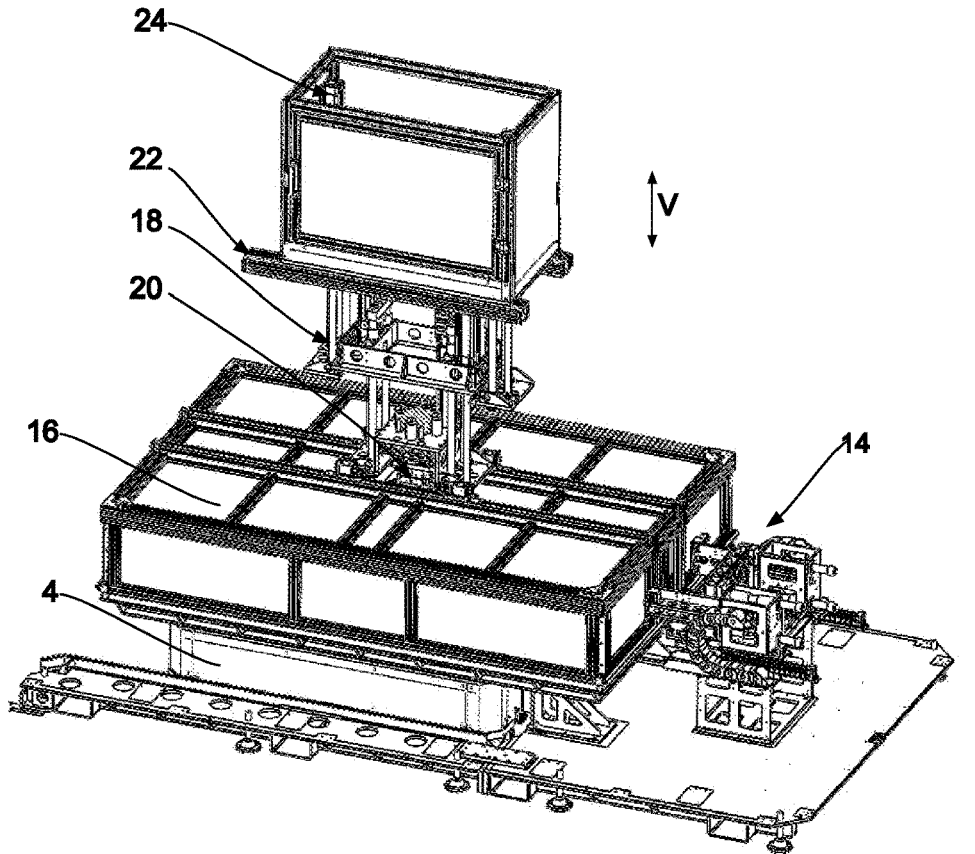
FIG. 6 shows the device from FIG. 1 with the fire protection hood in a position lowered onto the transport carriage.
Figures 9, 10:
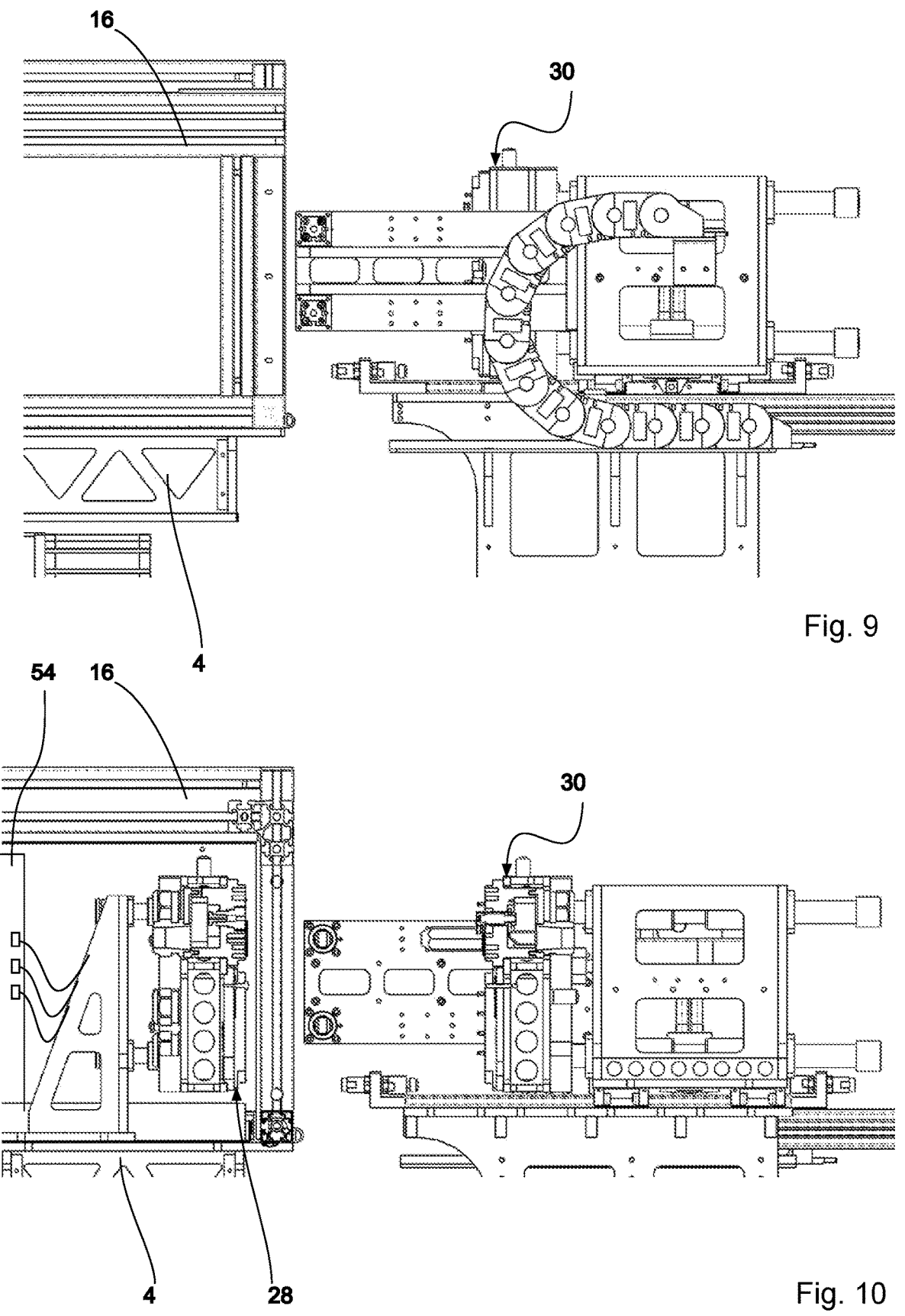
FIG. 9 shows the interface in a side view in the decoupled state with the fire protection hood in a position lowered onto the transport carriage.
FIG. 10 shows the interface in a side view in the decoupled state with the fire protection hood in a position lowered onto the transport carriage, with fire protection hood shown partially transparent.

If one of the sensors 48, 50 detects the exceeding of a specified threshold value, i.e., for example, an excessive temperature in the interior of the battery 54 or an excessive smoke gas development, the fire protection hood 16 is lowered onto the transport carriage 4 in order to encapsulate or shield the battery 54 from the surroundings U (FIG. 6, FIG. 9, FIG. 10).

The interface 14 is decoupled before and/or during the lowering of the fire protection hood 16. The fire protection hood 16 shields both the battery 54 and the first connection arrangement 20 from the surroundings U in the state lowered completely onto the transport carriage 4 (FIG. 9, FIG. 10).

Figure 11:
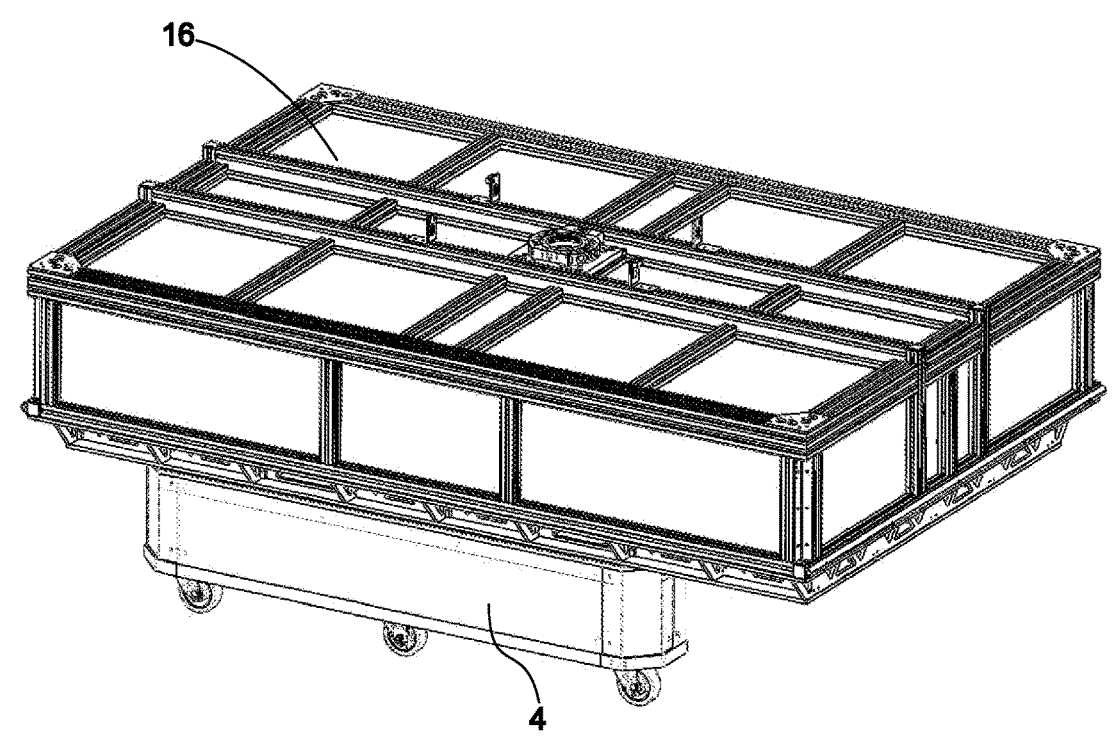
FIG. 11 shows the transport carriage with the fire protection hood during the transport away.

After the lowering of the fire protection hood 16 on the transport carriage 4, the fire protection hood 16 is decoupled from the handling unit 18 and the lock 42 on the support structure 32 is also released or decoupled. There is therefore no longer a mechanical connection between the transport carriage 4 and the support structure 32. The transport carriage 4 can transport the battery 54, which has caught on fire, together with the fire protection hood 16 lowered onto the transport carriage 4 out of the test position 12, as shown by way of example in FIG. 11 (method step D2).

Figure 13:
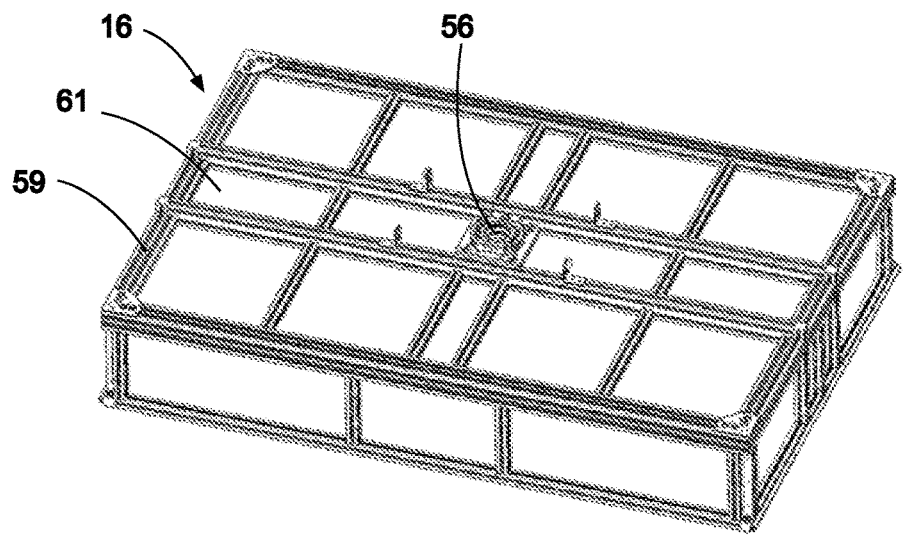
FIG. 13 shows the fire protection hood in a perspective view from above.
Figure 14:
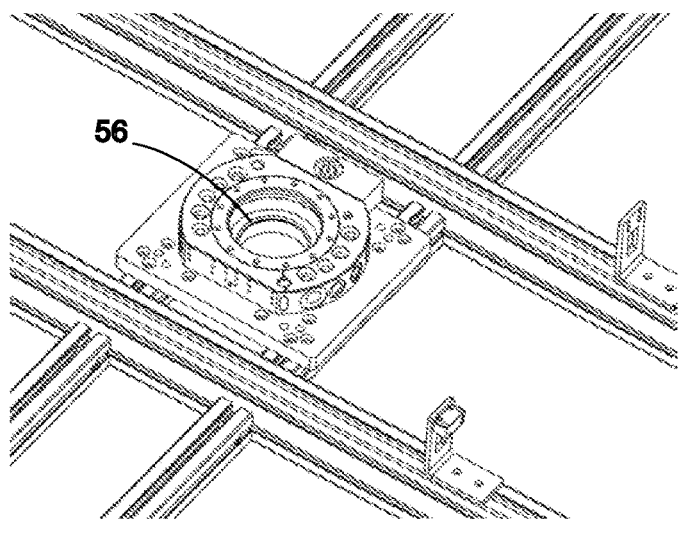
FIG. 14 shows a detail enlargement of FIG. 13.
Figure 15:
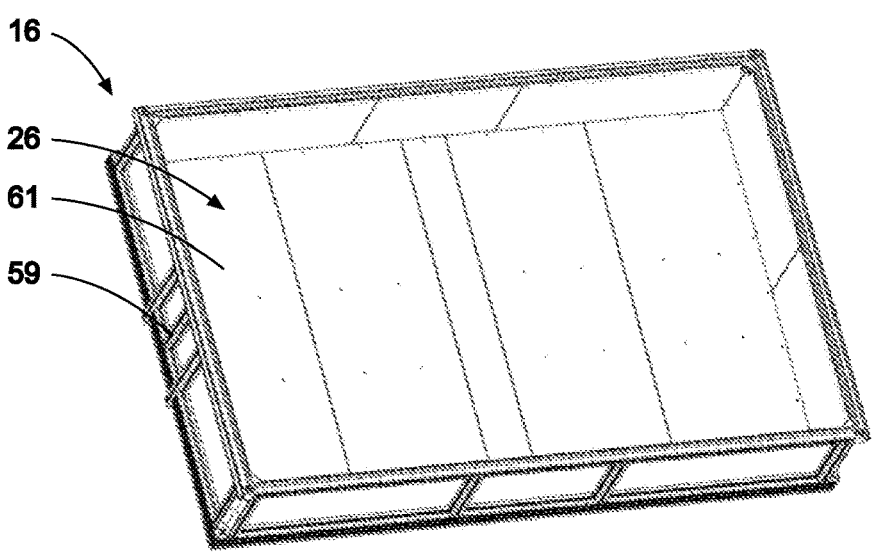
FIG. 15 shows the fire protection hood in a perspective view from below.
Figure 16:
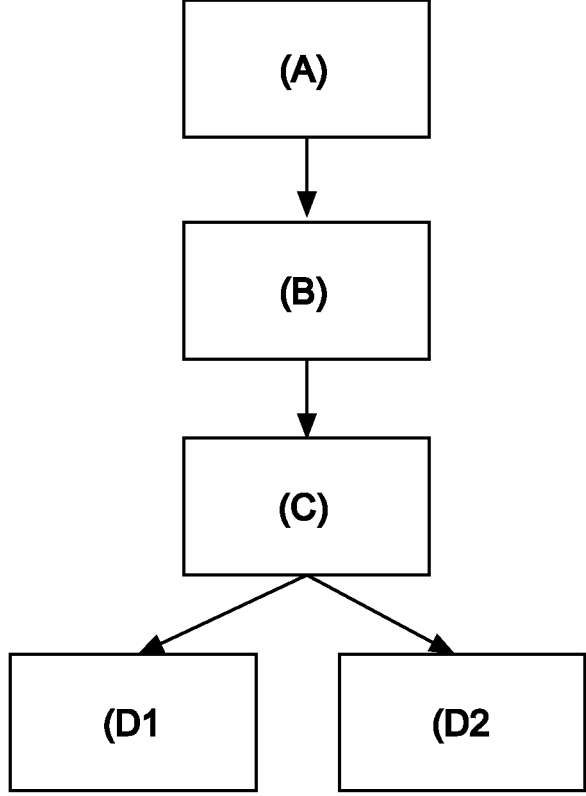
FIG. 16 shows a flow chart of a method according to the disclosure.

FIG. 13 shows the fire protection hood 16 in an isolated illustration with a detail enlargement of a connection piece 56 (FIG. 14) for coupling the fire protection hood 16 to the handling unit 18.

The fire protection hood 16 has a skeleton construction and includes a framework skeleton 59 having planar filler elements 61. The planar filler elements 61 are fire protection plates.

The framework skeleton 59 is formed at least partially from aluminum or aluminum alloys. The fire protection plates 61 include a noncombustible filler material. The fire protection plates 61 are held releasably and exchangeably on the framework skeleton 59 and in the present case are screwed to the framework skeleton 59.

The invention claimed is:

1. A device for testing a battery,
having a transport system, wherein the transport system is configured
for receiving the battery,
for transporting the battery to a test position, and
for transporting the battery out of the test position;
the device being configured for a simultaneous leak-tightness test and power test of the battery arranged in the test position having an interface,
wherein the interface is configured to supply the battery arranged in the test position with electric power; and
wherein the interface is configured to introduce gas into the battery arranged in the test position for the leak-tightness test of the battery,
having a fire protection hood, which can be lowered onto the transport system, for shielding the battery from the surroundings is provided,
wherein the fire protection hood is configured to be automatically lowered to shield the battery from the surroundings if a hazardous situation is detected, while the fire protection hood remains in a waiting position above the test position viewed in the vertical direction during testing, if test of the battery runs without errors.

2. The device as claimed in claim 1,
wherein
the fire protection hood can be lowered in a solely linear movement onto the transport system.

3. The device as claimed in claim 1,
wherein
a handling unit is provided, wherein the handling unit is configured for automatically lowering and raising the fire protection hood, wherein the handling unit includes a coupling for coupling the fire protection hood to the handling unit and for decoupling the fire protection hood from the handling unit, and the handling unit includes a carrier, which is arranged above the test position viewed in the vertical direction, on which an axis of the handling unit for lowering and raising the fire protection hood is arranged, wherein the axis is a linear axis.

4. The device as claimed in claim 1,
wherein
the fire protection hood includes a fireproof material, is coated using a fireproof material, or comprises a fireproof material,
and/or
the fire protection hood is essentially cuboid and includes an opening facing toward the test position and/or
the fire protection hood is embodied in skeleton construction, having a framework skeleton and planar filler elements arranged thereon, which are releasably connected to the framework skeleton.

5. The device as claimed in claim 1,
wherein
the interface has a first connection arrangement, which is fastened on the transport system and
the interface has a second connection arrangement, which is connectable to the first connection arrangement,
wherein the first connection arrangement is movable by the transport system relative to the second connection arrangement,
wherein the fire protection hood covers the first connection arrangement and shields it from the surroundings in a state lowered onto the transport system and
the fire protection hood does not cover the second connection arrangement in the state lowered onto the transport system, and wherein the second connection arrangement is fastened on the support structure.

6. The device as claimed in claim 1,
wherein
the test position is specified by a support structure, wherein
a mechanical actuator is held on the support structure, and at least a part of the mechanical lock is fastened on the support structure.

7. The device as claimed in claim 1,
wherein
the interface can be automatically coupled and decoupled,
wherein the interface is assigned a mechanical actuator for automatically coupling and decoupling the interface.

8. The device as claimed in claim 1,
wherein
at least one mechanical lock is provided, in order to lock and/or align the battery to be tested and/or a transport system in the test position, wherein the mechanical lock is configured to be automatically coupled and decoupled, wherein the transport carriage is alignable and lockable by the mechanical lock.

9. The device as claimed in claim 1,
wherein
the transport system includes a transport carriage.

10. The device as claimed in claim 5,
wherein the first connection arrangement is received on a mount of the transport carriage.

11. The device as claimed in claim 1,
wherein
the interface includes contact elements for establishing an electrically conductive connection.

12. The device as claimed in claim 1,
wherein
the interface includes contact elements for establishing a fluid connection, for introducing gas for the leak-tightness test into the battery arranged in the test position,
wherein an inert gas is configured to be provided via the interface for the leak-tightness test,
wherein the device is configured for the simultaneous leak-tightness test and power test of the battery arranged in the test position,
wherein the interface is configured both to supply the battery arranged in the test position with electric power and to introduce gas into the battery arranged in the test position.

13. The device as claimed in claim 1, wherein a temperature sensor is provided for monitoring the temperature of the battery to be tested, and/or a smoke gas sensor is provided for monitoring a smoke development of a battery to be tested, wherein the fire protection hood can be lowered automatically in dependence on a signal of the temperature sensor and/or the smoke gas sensor.

14. The device as claimed in claim 1, wherein the interface includes contact elements for establishing a fluid connection, for introducing coolant medium into a cooling circuit of the battery arranged in the test position.

15. A method for testing a battery, having the following method steps:

providing the battery to be tested on a transport system;

transporting the battery into a test position by the transport system; and supplying the battery to be tested with electric power and with gas via an interface for a simultaneous leak-tightness test and power test of the battery arranged in the test position, wherein a fire protection hood, which can be lowered onto the transport system, is provided for shielding the battery to be tested from the surroundings, wherein the interface is automatically decoupled before the lowering of the fire protection hood and/or during the lowering of the fire protection hood, wherein during and/or after the supply of the battery to be tested with electric power and/or during a discharge of the battery, a temperature of the battery to be tested is monitored, and/or a smoke development of the battery is monitored, and the fire protection hood for shielding the battery to be tested is lowered onto the transport system if a threshold value of the temperature and/or a threshold value of the smoke development is exceeded, wherein the fire protection hood, after being lowered onto the transport system, is automatically decoupled from a handling unit, which carries the fire protection hood, wherein the battery is automatically transported out of the test position after the lowering and decoupling of the fire protection hood.

16. The method as claimed in claim 15, wherein a transport carriage of the transport system is locked and/or aligned by a mechanical lock in order to position the battery to be tested in the test position, wherein the mechanical lock is automatically decoupled after the lowering of the fire protection hood.

17. The method as claimed in claim 15, wherein the battery to be tested is, via the interface, both supplied with electric power and filled with a gas, wherein both a power test and a leak-tightness test of the battery are carried out simultaneously and/or the battery to be tested is supplied via the interface with a coolant fluid for cooling the battery.

\* \* \* \* \*